(12) United States Patent
Okawara et al.

(10) Patent No.: US 7,615,287 B2
(45) Date of Patent: Nov. 10, 2009

(54) GAS BARRIER FILM

(75) Inventors: Chiharu Okawara, Tokyo (JP); Shigenobu Yoshida, Tokyo (JP); Tooru Hachisuka, Tokyo (JP)

(73) Assignee: Mitsubishi Plastics, Inc., Tokyo (JP)

( * ) Notice: Subject to any disclaimer, the term of this patent is extended or adjusted under 35 U.S.C. 154(b) by 600 days.

(21) Appl. No.: 10/595,789

(22) PCT Filed: Nov. 29, 2004

(86) PCT No.: PCT/JP2004/017680

§ 371 (c)(1), (2), (4) Date: May 11, 2006

(87) PCT Pub. No.: WO2005/051651

PCT Pub. Date: Jun. 9, 2005

(65) Prior Publication Data

US 2007/0071982 A1    Mar. 29, 2007

(30) Foreign Application Priority Data

Nov. 27, 2003 (JP) ............................. 2003-397729

(51) Int. Cl.
*B32B 9/00* (2006.01)
*B05D 3/10* (2006.01)

(52) U.S. Cl. .................... 428/451; 427/343; 427/397.8; 427/419.1; 428/446

(58) Field of Classification Search ................. 428/446, 428/451; 427/343, 397.8, 419.1
See application file for complete search history.

(56) References Cited

FOREIGN PATENT DOCUMENTS

| JP | 06-016848 | 1/1994 |
|---|---|---|
| JP | 08-224795 | 9/1996 |
| JP | 2002-283492 | 10/2002 |

OTHER PUBLICATIONS

International Search Report for PCT/JP2004/017680 mailed Mar. 15, 2005.

*Primary Examiner*—D. S Nakarani
(74) *Attorney, Agent, or Firm*—Darby & Darby

(57) ABSTRACT

The gas barrier film having a thermoplastic polymer film, and an inorganic thin film provided on at least one surface of the thermoplastic polymer film, which gas barrier film is formed by applying, to the inorganic thin film, a solution which contains at least one ion species selected from the group consisting of alkali metal ions, alkaline earth metal ions, and ammonium ions and originating from a low-molecular-weight electrolyte having a molecular weight of 1,000 or less and which has a total ion concentration of the ion species of $1\times10^{-5}$ mol/L or more and less than 10 mol/L and a solution concentration less than a saturation concentration.

18 Claims, No Drawings

GAS BARRIER FILM

This application is a U.S. national phase application under 35 U.S.C. §371 of International Patent Application No. PCT/JP 2004/17680, filed Nov. 29, 2004, and claims the benefit of Japanese Application No. 2003-397729 filed Nov. 27, 2003. The International Application was published in Japanese on Jun. 9, 2005 as International Publication No. WO 2005/051651 under PCT Article 21(2).

TECHNICAL FIELD

The present invention relates to a gas barrier film which exhibits excellent gas barrier performance and is suitably employed as any of a variety of wrapping materials.

BACKGROUND ART

Conventionally, gas barrier plastic film, which has a plastic film support and, provided on a surface of the plastic film support, an inorganic thin film formed of a material such as silicon oxide, aluminum oxide, or magnesium oxide, is widely employed as a wrapping material for articles which must be isolated from gases such as water vapor and oxygen; e.g., a wrapping material for preventing deterioration of food, industrial materials, drugs, etc. In addition to the wrapping use, in recent years, such gas barrier plastic films have been envisaged to find new uses as a transparent conductive sheet for use in devices such as liquid crystal displays, solar cells, electromagnetic shields, touch panels, EL substrates, and color filters.

Various improvements have been investigated with respect to the above gas barrier plastic films each having an inorganic thin film provided on a support (hereinafter may be referred to as "inorganic thin film-attached gas barrier films"), from the viewpoint of prevention of deterioration in gas barrier performance. Among the improvements, in one known approach, a coating layer formed of polyurethane, polyester, or a mixture of polyurethane and polyester is provided on a surface of the inorganic thin film (see, for example, .[Patent Document 1] Japanese Patent Application Laid-Open (kokai) No. 2-50837. Other approaches have also been known; for example, a gas barrier film in which a mixture of a water-soluble polymer and a metal alkoxide is applied onto a surface of the inorganic thin film (see, for example, [Patent Document 2] Japanese Patent Application Laid-Open (kokai) No. 8-267637 a gas barrier film in which a mixture of a water-soluble polymer and inorganic particles is applied onto a surface of the inorganic thin film (see, for example,) [Patent Document 3] Japanese Patent Application Laid-Open (kokai) No. 11-151786, and a gas barrier film in which a gas barrier resin such as a vinylidene chloride copolymer or an ethylene-vinyl alcohol copolymer is applied onto a surface of the inorganic thin film (see, for example, [Patent Document 4] Japanese Patent Application Laid-Open (kokai) No. 7-80986.

However, the above approaches are merely means for preventing deterioration in gas barrier performance which the inorganic thin film-attached gas barrier film per se exhibits upon use, such as secondary processing. Hitherto, there have never been disclosed means for improving the intrinsic gas barrier performance of a film having an inorganic thin film.

Meanwhile, gas barrier performance of inorganic thin film-attached gas barrier film is generally improved after production thereof, since conditions of the inorganic thin film are stabilized with elapse of time. Thus, gas barrier performance of the film immediately after production thereof is to be further improved. One disclosed means for enhancing gas barrier performance includes providing water to silicon oxide thin film and heating the film (see, for example, [Patent Document 5] Japanese Patent No. 2674827. However, this method has two steps, and the attained gas barrier performance is insufficient in relation to the characteristic level required for wrapping materials in recent years. There is also proposed an approach in which a non-electrolytic water-soluble substance such as poly(vinyl alcohol) is provided as a protective film on a surface of alumina film (see, for example, [Patent Document 6] Japanese Patent Application Laid-Open (kokai) No. 10-100301, but the water vapor barrier performance thereof is still insufficient. There are further proposed an approach in which a water vapor trapping layer containing a hygroscopic material is provided on a gas barrier layer formed of a metal oxide (see, for example, Patent Document 7] Japanese Patent Application Laid-Open (kokai) No. 10-329256 and another approach in which a gas barrier layer is formed from a layer containing a silicic acid condensate and a layer containing high-hydrogen-bond resin and an acidic substance (see, for example, [Patent Document 8] Japanese Patent Application Laid-Open (kokai) No. 2003-170522 but these gas barrier films still exhibit insufficient water vapor barrier performance.

SUMMARY OF THE INVENTION

An object to be attained by the present invention is to provide a film which exhibits high gas barrier performance from immediately after production thereof and gas barrier performance higher than that conventionally attained, with the smallest possible number of processing steps and at low cost.

The aforementioned object of the present invention can be attained by the following gas barrier film; i.e., a gas barrier film comprising a thermoplastic polymer film, and an inorganic thin film provided on at least one surface of the thermoplastic polymer film, which gas barrier film is formed by applying, to the inorganic thin film, a solution which contains at least one ion species selected from the group consisting of alkali metal ions, alkaline earth metal ions, and ammonium ions and originating from a low-molecular-weight electrolyte having a molecular weight of 1,000 or less and which has a total ion concentration (concentration of the entirety of the abovementioned ion species) of $1 \times 10^{-5}$ mol/L or more and less than 10 mol/L and a solution concentration less than a saturation concentration, or a gas barrier film comprising a thermoplastic polymer film, and an inorganic thin film provided on at least one surface of the thermoplastic polymer film, which gas barrier film is formed by applying, to the inorganic thin film, a solution which contains at least one ion species selected from the group consisting of alkali metal ions, alkaline earth metal ions, and ammonium ions and originating from a low-molecular-weight electrolyte having a molecular weight of 1,000 or less such that the total weight of the ion species in a film area of 1.00 $m^2$ is adjusted to 1.0 µg to 30 g.

As compared with conventional gas barrier films, the gas barrier film of the present invention exhibits higher gas barrier performance while the number of processing steps and an increase in cost are suppressed to minimum levels, and can exhibit sufficient gas barrier performance from immediately after production thereof. Therefore, the gas barrier film of the invention is of great value, since the film satisfies characteristic level of wrapping materials in recent years.

DETAILED DESCRIPTION OF THE INVENTION

The present invention will next be described in detail.

The thermoplastic polymer film employed in the present invention serves as a support of the gas barrier film of the present invention. No particular limitation is imposed on the material for the polymer film, and any resin may be used so long as the resin can be generally employed for wrapping material. Examples of the resin include polyolefins such as homopolymers and copolymers of ethylene, propylene, butene, etc.; amorphous polyolefins such as cyclic polyolefin; polyesters such as poly(ethylene terephthalate) and poly(ethylene 2,6-naphthalate); polyamides such as nylon 6, nylon 66, nylon 12, and copolymer nylon; ethylene-vinyl acetate copolymer partial hydrolyzates (EVOH); polyimides; polyether-imides; polysulfones; polyether-sulfones; polyether-ketones; polycarbonates; poly(vinyl butyral); polyarylates; fluororesins; acrylate resins; and biodegradable resins. Among them, polyesters, polyamides, polyolefins, and biodegradable resins are preferred, from the viewpoint of film strength, cost, etc.

The aforementioned thermoplastic polymer film may contain known additives such as an antistatic agent, a light-blocking agent, a UV-absorber, a plasticizer, a lubricant (for plastic filler), a filler, a colorant, a stabilizer, a lubricant, a cross-linking agent, an anti-blocking agent, and an antioxidant.

The aforementioned thermoplastic polymer film is produced through molding the aforementioned raw material(s). When employed as a support, the film may be unstretched or stretched. The film may be laminated with other plastic material members. The thermoplastic polymer film can be produced through any of known methods selected from the viewpoint of thin film formability and productivity. For example, a resin raw material is melted by means of an extruder and extruded through a circular or T die set, followed by quenching, to thereby produce unstretched film which is virtually amorphous and non-oriented. The unstretched film is stretched in a film flow direction (machine direction) or in a direction normal thereto (transverse direction) through a known method such as monoaxial stretching, tenter-based successive biaxial stretching, tenter-based simultaneous biaxial stretching, or tubular simultaneous biaxial stretching, to thereby produce a film stretched at least in one axial direction.

The thermoplastic polymer film generally has a thickness of 5 to 500 μm, preferably 10 to 200 μm, selected from the viewpoint of mechanical strength, flexibility, transparency, etc., of the gas barrier film support of the present invention in depending on the use thereof. The polymer film includes a sheet-like film having a large thickness. No particular limitation is imposed on the width and length of the film, and these dimensions may be appropriately selected in accordance with the use thereof.

Preferably, an anchor coating agent is applied to the aforementioned thermoplastic polymer film in order to enhance adhesion with the inorganic thin film. Examples of the anchor coating agent include polyester resins, isocyanate resins, urethane resins, acrylic resins, vinyl alcohol resins, ethylene-vinyl alcohol resins, vinyl-modified resins, epoxy resins, oxazoline-group-containing resins, modified styrene resins, modified silicone resins, and alkyl titanate. These anchor coating agent may be soluble in a solvent or water, and may be used singly or in combination of two or more species. Of these, polyester resins, urethane resins, acrylic resins, and oxazoline-group-containing resins are preferred.

The anchor coat layer preferably has a thickness of 0.005 to 5 μm, more preferably 0.01 to 1 μm. When the thickness is 5 μm or less, peeling of the anchor coat layer from the support film due to inside stress thereof is difficult to occur and excellent lubricity is realized, whereas when the thickness 0.005 μm or more, uniform thickness can be maintained. Both cases are preferred.

In order to improve applicability and adhesion of the anchor coating agent to the support film, the film may be subjected to customary surface treatment such as chemical treatment or discharge treatment before application of the anchor coating agent.

Examples of the inorganic substance for forming the inorganic thin film provided on at least one surface of the thermoplastic polymer film include silicon, aluminum, magnesium, zinc, tin, nickel, titanium, hydrocarbons, oxides thereof, carbides thereof, nitrides thereof, and mixtures thereof. Among them, silicon oxide, aluminum oxide, and diamond-like carbon predominantly formed from hydrocarbon. Particularly, silicon oxide is most preferred in that it exhibits a remarkable effect during heat treatment mentioned later and consistent gas barrier performance.

No particular limitation is imposed on the method for producing the inorganic thin film, and any methods such as vapor deposition and coating may be employed. Among them, vapor deposition is preferred in that a uniform thin film exhibiting high gas barrier performance can be produced. Specific examples of vapor deposition techniques include vacuum vapor deposition, ion plating, sputtering, and CVD.

The inorganic thin film generally has a thickness of 0.1 to 500 nm, preferably 0.5 to 40 nm. When the thickness falls within the above range, sufficient gas barrier performance can be attained, and the produced vapor-deposited film is has no cracks and peeled parts and exhibits excellent transparency.

Examples of the solution which contains at least one ion species selected from the group consisting of alkali metal ions, alkaline earth metal ions, and ammonium ions and originating from a low-molecular-weight electrolyte having a molecular weight of 1,000 or less (hereinafter the solution may be referred to as "the solution of the present invention") to be applied to the aforementioned inorganic thin film include aqueous and non-aqueous solutions of salts of an alkali metal, an alkaline earth metal, or an ammonium dissolved in water or organic solvents, and examples of the salts include inorganic salts such as chlorides, hydroxides, oxides, carbonates, hypochlorites, sulfites, thiosulfates, phosphates, phosphates, and hypophosphites; organic salts such as acetates, fatty acid salts, and (meth)acrylates; polyhydric alcohol sulfate ester salts; fatty acid amine sulfates; fatty acid amide sulfates; fatty acid amide sulfonates; alkylaryl sulfonates; and aliphatic alcohol phosphate ester salts. In the present invention, ions originating from low-molecular-weight electrolytes represented by the above substances can effectively exhibit the effect of the present invention. Particularly, these ions are preferably in the free form in the solution. The low-molecular-weight electrolyte having a molecular weight of 1,000 or less preferably has a molecular weight of 750 or less, more preferably 500 or less from the viewpoint of gas barrier performance and other properties.

The above compounds may be used in combination of two or more species so long as these compounds are not mutually reacted with one another. From the viewpoint of cost and handling, a solution of the chloride(s) dissolved in water is preferably employed.

Examples of employable organic solvents include those listed in "Law on Industrial Safety and Hygiene, implementation ordinance (Table 6-2 attached)." Among them, from the viewpoint of general applicability, preferably employed are alcohols such as isopropyl alcohol and butanol; esters such as ethyl acetate and butyl acetate; aromatic hydrocarbons such as toluene and xylene; ketones such as methyl ethyl ketone and methyl butyl ketone; and mixtures thereof as well as cellosolve acetate and similar material not listed in the Table.

In the solution of the present invention, the total ion concentration of the alkali metal ions, alkaline earth metal ions, and ammonium ions present in the solution is $1 \times 10^{-5}$ mol/L or more and less than 10 mol/L. Depending on the type of substance, the corresponding solution concentration exceeds a dissolution saturation concentration before reaching 10 mol/L. In this case, the upper limit of the concentration is less than a saturation concentration. The above total ion concentration is preferably $1 \times 10^{-4}$ mol/L to $1 \times 10^{-1}$ mol/L, more preferably $1 \times 10^{-3}$ mol/L to $1 \times 10^{-1}$ mol/L.

The coating amount of the solution of the present invention is such that the total weight of the ion species (selected from among alkali metal ions, alkaline earth metal ions, and ammonium ions and originating from a low-molecular-weight electrolyte having a molecular weight of 1,000 or less) in a film area of 1.00 $m^2$ is adjusted to 1.0 µg to 30 g, preferably 15 µg to 3.0 g, more preferably 150 µg to 300 mg.

When the solution of the present invention has a total ion concentration in terms of the above ions is less than $1 \times 10^{-5}$ mol/L, or when the total coating amount of the above ions is less than 1.0 µg in a film area of 1.00 $m^2$, the effect of the present invention cannot be attained due to an excessively small ion concentration, whereas when the total ion concentration is in excess of 10 mol/L, or when the total coating amount of the above ions is in excess of 30 g in a film area of 1 $m^2$, these ions form deposits during drying resulting in bad appearance and poor adhesion of component layers in stacked structures. According to the present invention, alkali metal ions, alkaline earth metal ions, or ammonium ions, which are released in the solution, permeate the inorganic thin film and are adsorbed in the film. The thus-adsorbed ion species remarkably inhibit migration and penetration of water vapor into the vapor-deposited film, thereby exhibiting remarkable gas barrier performance. The gas barrier film of the present invention exhibits excellent gas barrier performance from immediately after production thereof.

In the present invention, depending on the use of the gas barrier film, the surface onto which the above solution has been applied may be washed with a solution free of these ions or pure water after adsorption of an alkali metal ion, an alkaline earth metal ion, and/or an ammonium ion.

The solution of the present invention may be used in the form of a mixture with at least one solution selected from among resin solutions and metal oxide sol solutions so as to also have a protective function to the inorganic thin film. In some preferred embodiments, when aqueous, the solution of the present invention is combined with an aqueous resin solution, whereas when non-aqueous, the solution is combined with a non-aqueous resin solution.

The resin for preparing the resin solutions may be a resin which is solvent-soluble and/or solvent-dispersible. Examples of the resin include polymer electrolytes, polymer non-electrolytes, and ion-crosslinked polymers. Specific examples include polyester resins, isocyanate resins, urethane resins, (meth)acrylic resins, ethylene-(meth)acrylic copolymer resins, vinyl alcohol resins, ethylene-vinyl alcohol resins, vinyl-modified resins, partially saponified vinyl acetate resins, ethylene oxide resins, epoxy resins, oxazoline-group-containing resins, modified styrene resins, cellulose (derivative) resins, modified silicone resins, and alkyl titanate. These resins may be used singly or in combination of two or more species.

According to the present invention, secondary processing characteristics such as printing resistance and folding endurance of the gas barrier film can be enhanced through employment of the above resin(s). From this standpoint, when the resin(s) are used in the present invention, the coating solution thereof preferably has a solid content of 50 wt. % or less, more preferably 30 wt. % or less.

In the present invention, even when the solution which contains at least one ion species selected from the group consisting of alkali metal ions, alkaline earth metal ions, and ammonium ions and originating from a low-molecular-weight electrolyte having a molecular weight of 1,000 or less is mixed with the aforementioned resin solution, the concentration of the mixture in terms of the aforementioned ions originating from low-molecular-weight electrolyte preferably falls within the same range as mentioned in relation to the case where the resin solution is not added to the solution.

When the solution containing the resin(s) is applied, the formed coating layer preferably has a thickness of about 0.01 to 2 µm.

As mentioned above, in the present invention, the resin solution may be added to the solution of the present invention. In an alternative manner, the solution which contains at least one ion species selected from the group consisting of alkali metal ions, alkaline earth metal ions, and ammonium ions and originating from a low-molecular-weight electrolyte having a molecular weight of 1,000 or less but which does not contain the above resin is applied, and subsequently, the solution containing the resin is applied. The thus-formed coating layer preferably has a thickness of about 0.01 to 2 µm. Examples of the resin employed in the resin solution include the aforementioned aqueous resin, non-aqueous resins, and resins hardenable by active energy rays.

Examples of the metal oxide sol which can be mixed with the solution of the present invention include sol of a metal oxide such as silica, antimony oxide, zirconium oxide, aluminum oxide, cerium oxide, and titanium oxide, and a sol of a mixture of these metal oxides. No particular limitation is imposed on the particle size of the metal oxide, and the particle size is preferably 4 to 10 nm. The metal oxide sol is generally used in the form of 10 to 90 mass % aqueous liquid. The liquid may be appropriately diluted with an aqueous solvent such as alcohol, an aqueous polymer such as poly (vinyl alcohol), or a similar medium.

When the solution of the present invention is mixed with the aqueous solution containing the sol, the total ion concentration preferably falls within the same range as mentioned in relation to the case where the sol solution is not added to the solution. In an alternative manner, the solution of the present invention not containing the sol is applied, and subsequently, the sol is applied. When the solution containing the sol is applied, the formed coating layer preferably has a thickness of about 0.01 to 2 µm.

As mentioned above, the solution of the present invention may be mixed with a resin solution and/or a metal oxide sol solution. The solution may further contain additives which are employed in gas barrier film or for general use.

The aforementioned solution containing an alkali metal ion, an alkaline earth metal ion, and/or an ammonium ion, the resin solution, and/or the metal oxide sol solution can be applied through a known technique by means of a reverse roll coater, a gravure coater, a rod coater, an air doctor coater, or a similar coater. After application, the solvent may be dried out through a known drying technique such as hot blow drying, hot roll drying, or infrared drying.

In addition to the aforementioned component layers, the gas barrier film of the present invention may further provided with an additional component layer stacked thereon in accordance with needs, and the thus-formed stacked gas barrier structures may be employed for appropriate uses.

In an embodiment generally carried out, a gas barrier stacked structure in which a plastic film is stacked on the surface of the gas barrier layer is employed for various uses. The above plastic film generally has a thickness of 5 to 500

μm, preferably 10 to 200 μm, in accordance with use of the stacked structure and from the viewpoint of mechanical strength, flexibility, and transparency, for also serving as a support of the stacked structure. No particular limitation is imposed on the width and length of the film, and these dimensions may be appropriately selected in accordance with uses thereof. When a heat-sealable resin is provided on the gas barrier layer, the stacked structure is imparted with heat-sealablity and can be employed as a variety containers. Examples of the heat-sealable resin include polyethylene resin, polypropylene resin, ethylene-vinyl acetate copolymer, ionomer resins, acrylic resins, and biodegradable resins, which are known resins.

In another embodiment of the gas barrier stacked structure, a printing layer is formed on the gas barrier layer of the gas barrier film of the present invention, and a heat-seal layer is stacked on the printing layer. The printing layer may be formed by use of a printing ink containing an aqueous or non-aqueous resin. Examples of the resin employed in the printing ink include acrylic resins, urethane-based resins, polyester-based resins, vinyl chloride-based resins, vinyl acetate copolymer resins, and mixtures thereof. To the printing ink, known additives such as an antistatic agent, a light-blocking agent, a UV-absorber, a plasticizer, a lubricant (for plastic filler), a filler, a colorant, a stabilizer, a lubricant, a defoaming agent, a cross-linking agent, an anti-blocking agent, and an antioxidant may be added.

No particular limitation is imposed on the printing method for forming the printing layer, and known printing methods such as offset printing, gravure printing, and screen printing may be employed. After printing, the solvent may be dried out through a known drying technique such as hot blow drying, hot roll drying, or infrared drying.

In addition, at least one layer of a paper sheet or a plastic film may be inserted between the printing layer and the heat seal layer. The plastic film may be the same as the thermoplastic polymer film employed in the gas barrier film of the present invention. Particularly, paper, polyester resins, polyamide resins, and biodegradable resins are preferred, from the viewpoint of attaining sufficient rigidity and strength of stacked structures.

In the present invention, after formation of the inorganic thin film; application of a solution which contains at least one ion species selected from the group consisting of alkali metal ions, alkaline earth metal ions, and ammonium ions and originating from a low-molecular-weight electrolyte having a molecular weight of 1,000 or less; or application of the resin solution and/or the metal oxide sol solution, heat treatment is preferably performed from the viewpoint of gas barrier performance, stabilization in film quality and coating layer quality, and other factors.

The conditions under which the heat treatment is performed vary in accordance with the type, thickness, etc. of the gas barrier film component layers. However, no particular limitation is imposed on the conditions so long as the temperature and time required for heat treatment can be maintained. For example, there may be employed the following methods: storing a gas barrier film in an oven or a thermostat chamber of which inside temperature is controlled to a required value; applying a hot blow to a gas barrier film; heating by means of an IR heater; irradiating a film with light from a lamp; direct heating through contact with a hot roll or a hot plate; and microwave irradiation. The film may be heated as it is or after cutting into pieces suitable for easy handling. So long as the temperature and time required for heat treatment can be attained, a heating apparatus may be integrated into a part of a film production device such as a coater or a slitter, and heat treatment may be performed during production of the gas barrier film.

No particular limitation is imposed on the heating temperature so long as the temperature is not higher than the melting point of the support, plastic film, etc. employed. Since heat treatment time for attaining the effect of heat treatment can be appropriately selected, the heating temperature is preferably 60° C. or higher, more preferably 70° C. or higher. The upper limit of heating temperature is generally 200° C., preferably 160° C., from the viewpoint of prevention of drop in gas barrier performance caused by thermal decomposition of a component(s) of the gas barrier film. The treatment time depends on the heat treatment temperature. The treatment time is preferably shorter as the treatment temperature is higher. For example, when the heat treatment temperature is 60° C., the treatment time is about 3 days to 6 months. When the heat treatment temperature is 80° C., the treatment time is about 3 hours to 10 days. When the heat treatment temperature is 120° C., the treatment time is about one hour to one day. When the heat treatment temperature is 150° C., the treatment time is about 3 to 60 minutes. These conditions described here are merely examples, and the time and temperature for heat treatment may be appropriately modified in accordance with the type, thickness, etc. of the gas barrier film component(s).

In the gas barrier film of the present invention, in order to exhibit excellent gas barrier performance, the inorganic thin film (preferably the inorganic film containing silicon oxide) preferably has a total alkali metal ion and alkaline earth metal ion concentration in a film area of 1.00 m², as determined through inductively coupled plasma Auger electron spectroscopy (ICP-AES), of 2.0 μg to 1,000 μg, more preferably 2.0 μg to 500 μg, particularly preferably 5.0 μg to 200 μg.

The silicon oxide-containing inorganic thin film of the gas barrier film of the present invention preferably has a ratio of total ion intensity A to ion intensity B (A/B), as determined by means of a time-of-flight secondary ion mass spectrometer (TOF-SIMS), of $0.20 \leq A/B \leq 100$, more preferably $0.25 \leq A/B \leq 10$, wherein ion intensity A represents the sum of peak intensities attributed to total alkali metal ions, alkaline earth metal ions, and ammonium ions contained in the thin film, and ion intensity B represents a peak intensity attributed to $^{30}Si$.

Furthermore, the silicon oxide-containing inorganic thin film of the gas barrier film of the present invention preferably has a ratio of ion intensity C to ion intensity B ($^{30}Si$) (C/B), as determined by means of a TOF-SIMS, of $0.040 \leq C/B \leq 0.50$, more preferably $0.050 \leq C/B \leq 0.10$, wherein ion intensity C represents a peak intensity attributed to $^{30}SiOH$.

In the terms "ion intensity A" (the sum of peak intensities attributed to total alkali metal ions, alkaline earth metal ions, and ammonium ions) and "ion intensity B" (a peak intensity attributed to $^{30}Si$), these ions contained in the inorganic thin film are detected as corresponding ion species during TOF-SIMS analysis.

In the present invention, when alkali metal ions, alkaline earth metal ions, and ammonium ions permeate the inorganic thin film, the space (holes and nanopores) is filled with the ions, inhibiting gas permeation. In addition, alkali metal ions, alkaline earth metal ions, and ammonium ions decompose water molecule clusters to form monomeric water molecules, facilitating permeation of water molecules in the inorganic thin film. The water molecules permeating the inorganic thin film are linked to a thin film component to form a silanol moiety or trapped in the space (holes and nanopores) present in the inorganic thin film, whereby the space is filled with the ions, thereby inhibiting gas permeation. Therefore, when the inorganic thin film exhibits ion intensities A/B and C/B falling within the above ranges, high gas barrier performance can be realized.

In the aforementioned TOF-SIMS analysis, the gas barrier film is subjected to sputtering, and analysis is performed in the thickness (depth) direction. In connection with the expression "in the inorganic thin film," the depth of the inorganic thin film ranges from the top surface thereof after physically adsorbed alkali metal ions, alkaline earth metal ions, and ammonium ions have been removed therefrom during the first sputtering to the top surface of the film support. The gas barrier film of the present invention preferably exhibits an A/B falling within the above range as determined at an arbitrary depth of the inorganic thin film.

Similarly, in terms of $^{30}$SiOH ion, the gas barrier film of the present invention preferably exhibits a C/B falling within the above range as determined in the inorganic thin film in the depth direction from the surface which has been subjected to the first sputtering to the top surface of the film support. The reason why ion intensity B is determined on the basis of $^{30}$Si ion is that $^{30}$Si, among the elements contained in the silicon oxide-containing thin film, is difficult to reach saturation in detectable intensity as compared with other Si isotopes of $^{28}$Si and $^{29}$Si, and to receive peak interference.

In the present invention, when the aforementioned A/B is 100 or less, deterioration due to deposits and damage in the thin film are difficult to occur, whereas when the A/B is 0.20 or more, alkali metal ions, alkaline earth metal ions, and ammonium ions are sufficiently adsorbed in the thin film, leading to excellent gas barrier performance. When C/B is 0.50 or less, silicon oxide present in the thin film includes a sufficient amount of Si—O chains, imparting excellent mechanical strength to the thin film, which is preferred. When C/B is 0.04 or more, gas permeation inhibitory effect is enhanced as compared with conventional inorganic thin film-attached gas barrier film.

EXAMPLES

The present invention will next be described in detail by way of examples, which should not be construed as limiting the invention thereto. In the Examples, film evaluation was performed as follows.

Metal Element Analysis of Thin Film (ICP)

As a preliminary treatment, a thin film (film area: 1.00 m$^2$) was cut into pieces (length: 50 cm, width: 5 cm), and these pieces were washed with ion-exchange water in a plastic bottle. The film pieces were dissolved in a solution containing hydrofluoric acid (15 mL), nitric acid (5 mL), and ion-exchange water (30 mL) placed in another plastic bottle (the solution after dissolution is referred to as solution (A)). Subsequently, remaining film pieces were washed with ion-exchange water in another plastic bottle (the wash liquid is referred to as solution (B)). Solutions (A) and (B) were transferred to a platinum crucible containing sulfuric acid (1 mL) so as to dry the solutions. Hydrochloric acid (2 mL) was added to the dried product, followed by heating, whereby inorganic substances deposited in the platinum crucible were dissolved (the solution after dissolution is referred to as solution (C)). Solution (C) was diluted in a 25-mL plastic measuring flask with ion-exchange water to adjust the concentration to a predetermined value, and the solution served as an analyte solution. Hydrofluoric acid, nitric acid, sulfuric acid, and hydrochloric acid used here were all EL reagents for use in the electronics industry or reagents for atomic absorption spectrometry. The employed plastic bottles were made of a material which does not release metallic elements.

The analysis was performed through inductively coupled plasma Auger electron spectroscopy (ICP-AES) by means of a spectrometer (model ICAP-55, product of NIPPON JARRELL-ASH). The results of the analysis are shown in Tables 1-1 and 1-2.

TOF-SIMS; Time-of-flight Secondary Ion Mass Spectrometry

The analysis was performed by means of a TOF-SIMS IV (product of ION-TOF), under the following conditions: primary ion conditions (Au$^+$, 25 kV, 1.0 pA, 100 μm×100 μm scanning), secondary ion collecting conditions (positive ion collection, 2 scan/cycle), sputtering conditions (Ar$^+$, 2 kV, 17 nA, 300 μm×300 μm scanning, 30 sec/cycle), and charge compensation (use of a flat gun).

Tables 1-1 and 1-2 show the maximum values of ion intensity ratios A/B and C/B of each thin film sample as determined through TOF-SIMS.

Percent Water Vapor Permeation

In accordance with the conditions as stipulated in JIS Z0222 "Moisture permeability test for moisture-proof package container" and JIS Z0208 "Moisture permeability test for moisture-proof wrapping material (cup method)," percent water vapor permeation was determined through the following procedure.

In each analysis, a four-side-sealed bag was fabricated from two gas barrier stacked films (moisture permeation area: 10.0 cm×10.0 cm), and calcium chloride anhydrate (about 20 g) serving as a hydroscopic agent was placed in the bag. The bag was placed in a thermo- and hygro-stat (40° C., RH: 90%), and weighed (precision: 0.1 mg) from day 0 to day 14 at intervals of 48 hours or longer. A period of 14 days was selected, since weight is considered to increase at a constant rate within this period of time. Percent water vapor permeation was calculated from the following equation:

$$\text{percent water vapor permeation (g/m}^2/24\text{ h)}=(m/s)/t,$$

wherein parameters are as follows:

m; increase in weight (g) between the last two measurements in the test, s; moisture permeation area (m$^2$), and t; duration (h)/(24 h) between the last two measurements in the test. The results are shown in Tables 1-1 and 1-2.

Example 1

A poly(ethylene terephthalate) resin (hereinafter abbreviated as PET) (Novapex, product of Mitsubishi Chemical Co., Ltd.) was melt-extruded through a routine method to form sheets thereof. Each sheet was stretched in the machine direction at 95° C. with a drawing ratio of 3.3 and, subsequently, stretched in the transverse direction at 110° C. with a drawing ratio of 3.3, to thereby produce a biaxially stretched PET film having a thickness of 12 μm. Onto one surface of the film, a mixture prepared from an isocyanate compound (Coronate L, product of Nippon Polyurethane Industry Co., Ltd.) and a saturated polyester (Vylon 300, product of Toyobo Co., Ltd.) at a weight ratio of 1:1 was applied, followed by drying, to thereby form an anchor coat layer having a thickness of 0.1 μm.

By means of a vacuum vapor deposition apparatus, SiO was vapor-deposited through high-frequency heating on the anchor coat layer under a vacuum of 1×10$^{-5}$ Torr, to thereby form a thin film having a thickness of about 30 nm, whereby an inorganic thin film-attached gas barrier film was produced.

Onto the inorganic thin film of the inorganic thin film-attached gas barrier film, an aqueous potassium chloride solution ($1\times10^{-3}$ mol/L) was applied by means of a bar coater such that the potassium ion amount in the coating was adjusted to about 890 μg/m². The coating was dried under a hot blow at 80° C. for three minutes, to thereby produce a gas barrier film. The transparency of the coated film was equivalent to that of the inorganic thin film-attached gas barrier film before coating.

Subsequently, an unstretched polypropylene film (thickness: 60 μm) (Pylen Film CT P1146, product of Toyobo Co., Ltd.) was dry-laminated on the coating surface of the thus-produced gas barrier film, to thereby form a laminate film. Percent water vapor permeation of the laminate film was determined.

Example 2

The procedure of Example 1 was repeated, except that an aqueous sodium chloride solution ($1\times10^{-3}$ mol/L) was applied onto the inorganic thin film such that the sodium ion amount in the coating was adjusted to about 530 μg/m², to thereby produce a laminate film.

Example 3

The procedure of Example 1 was repeated, except that an aqueous ammonium chloride solution ($1\times10^{-3}$ mol/L) was applied onto the inorganic thin film such that the ammonium ion amount in the coating was adjusted to about 410 μg/m², to thereby produce a laminate film.

Example 4

The procedure of Example 1 was repeated, except that a mixture containing a 10% aqueous liquid of poly(vinyl alcohol) (PVA, Poval N-300, product of Nippon Synthetic Chemical Industry Ltd.), a silica sol solution (Snowtex XS, solid content: 20 wt. %, product of Nissan Chemical Industry Ltd.), and an aqueous potassium chloride solution ($1\times10^{-1}$ mol/L) (potassium chloride concentration: $8.3\times10^{-2}$ mol/L) was applied onto the inorganic thin film such that the potassium ion amount in the coating was adjusted to about 74 mg/m², the solid content weight ratio PVA:silica was adjusted to 8:2, and the thickness (solid) was adjusted to 0.2 μm, to thereby produce a laminate film.

Example 5

The procedure of Example 1 was repeated, except that, after application and drying of the aqueous potassium chloride solution, an aqueous resin liquid mixture containing an oxazoline-group-containing polymer (Epocros WS-500, product of Nippon Shokubai Co., Ltd.) (60 wt. %), an aqueous acrylic resin (hereinafter referred to as resin A) (20 wt. %), and an aqueous urethane resin (hereinafter referred to as resin B) (20 wt. %) was applied onto the potassium ion coating surface such that the coating thickness (solid) of 0.2 μm, to thereby produce a laminate film.

Production of Resin A (Aqueous Acrylic Resin):

A mixture containing ethyl acrylate (40 parts by weight), methyl methacrylate (30 parts by weight), methacrylic acid (20 parts by weight), and glycidyl methacrylate (10 parts by weight) was allowed to polymerize in ethyl alcohol. After completion of polymerization, ethyl alcohol was removed by heating while water was added to the polymerization mixture. The pH of the mixture was adjusted to 7.5 with aqueous ammonia, to thereby produce an aqueous acrylic resin coating material.

Of Resin B (Aqueous Polyurethane Resin):

Firstly, a polyester-polyol formed of terephthalic acid (664 parts), isophthalic acid (631 parts), 1,4-butanediol (472 parts), and neopentyl glycol (447 parts) was produced. Then, adipic acid (321 parts) and dimethylolpropionic acid (268 parts) were added to the thus-produced polyester-polyol, to thereby produce polyester-polyol A having a pendant carboxylic group. Hexamethylene diisocyanate (160 parts) was added to the thus-produced polyester-polyol A (1,880 parts), to thereby prepare an aqueous polyurethane resin coating material.

Example 6

The procedure of Example 1 was repeated, except that an aqueous potassium chloride solution ($1\times10^{-2}$ mol/L) was applied onto the inorganic thin film such that the potassium ion amount in the coating was adjusted to about 8.9 mg/m², to thereby produce a laminate film.

Example 7

The procedure of Example 1 was repeated, except that an aqueous potassium chloride solution ($1\times10^{-4}$ mol/L) was applied onto the inorganic thin film such that the potassium ion amount in the coating was adjusted to about 89 μg/m², to thereby produce a laminate film.

Example 8

The procedure of Example 1 was repeated, except that an aqueous lithium chloride solution ($1\times10^{-3}$ mol/L) was applied onto the inorganic thin film such that the lithium ion amount in the coating was adjusted to about 160 μg/m², to thereby produce a laminate film.

Example 9

The procedure of Example 1 was repeated, except that an aqueous cesium chloride solution ($1\times10^{-3}$ mol/L) was applied onto the inorganic thin film such that the cesium ion amount in the coating was adjusted to about 3.0 mg/m², to thereby produce a laminate film.

Example 10

The procedure of Example 1 was repeated, except that an aqueous calcium chloride solution ($1\times10^{-3}$ mol/L) was applied onto the inorganic thin film such that the calcium ion amount in the coating was adjusted to about 920 μg/m², to thereby produce a laminate film.

Example 11

The procedure of Example 1 was repeated, except that an aqueous magnesium chloride solution ($1\times10^{-3}$ mol/L) was applied onto the inorganic thin film such that the magnesium ion amount in the coating was adjusted to about 560 μg/m², to thereby produce a laminate film.

Example 12

The procedure of Example 1 was repeated, except that an aqueous barium chloride solution ($1\times10^{-3}$ mol/L) was applied onto the inorganic thin film such that the barium ion amount in the coating was adjusted to about 3.1 mg/m², to thereby produce a laminate film.

Example 13

The procedure of Example 1 was repeated, except that a solution of sodium di(tridecylsulfo)succinate (molecular weight: 584) in toluene ($1\times10^{-3}$ mol/L) was applied onto the inorganic thin film such that the sodium ion amount in the coating was adjusted to about 530 μg/m², to thereby produce a laminate film.

Example 14

The procedure of Example 1 was repeated, except that an aqueous calcium oxide solution ($1\times10^{-3}$ mol/L) was applied onto the inorganic thin film such that the calcium ion amount in the coating was adjusted to about 910 μg/m², and the coated film was washed with ion-exchange water, to thereby produce a laminate film.

Example 15

The procedure of Example 1 was repeated, except that an aqueous sodium chloride solution ($1\times10^{-3}$ mol/L) was applied onto the inorganic thin film such that the sodium ion amount in the coating was adjusted to about 530 μg/m², followed by heating at 120° C. for one hour, to thereby produce a laminate film.

Example 16

The procedure of Example 1 was repeated, except that a mixture containing an aqueous ionomer-type urethane resin liquid (AP-40N, product of Dainippon Ink and Chemicals, Inc.) and an aqueous potassium chloride solution ($1\times10^{-2}$ mol/L) (potassium chloride concentration: $9.8\times10^{-3}$ mol/L) was applied onto the inorganic thin film such that the potassium ion amount in the coating was adjusted to about 8.8 mg/m², and the thickness (solid) was adjusted to 0.2 μm, to thereby produce a laminate film.

Example 17

The procedure of Example 1 was repeated, except that a mixture containing an aqueous acrylic resin liquid (Joncryl 840, product of Johnson Polymer's products) and an aqueous potassium chloride solution ($1\times10^{-2}$ mol/L) (potassium chloride concentration: $9.8\times10^{-3}$ mol/L) was applied onto the inorganic thin film such that the potassium ion amount in the coating was adjusted to about 8.8 mg/m², and the thickness (solid) was adjusted to 0.2 μm, to thereby produce a laminate film.

Example 18

The procedure of Example 1 was repeated, except that a mixture containing an aqueous polyester resin liquid (Pes Resin A-120, product of Takamatsu Yushi Co., Ltd.) and an aqueous potassium chloride solution ($1\times10^{-2}$ mol/L) (potassium chloride concentration: $9.7\times10^{-3}$ mol/L) was applied onto the inorganic thin film such that the potassium ion amount in the coating was adjusted to about 8.7 mg/m², and the thickness (solid) was adjusted to 0.2 μm, to thereby produce a laminate film.

Comparative Example 1

The procedure of Example 1 was repeated, except that dry-lamination was performed without applying aqueous metal salt solution, to thereby produce a laminate film.

Comparative Example 2

The procedure of Example 1 was repeated, except that ion-exchange water (resistivity: 18 Ω/cm) was applied instead of the aqueous metal salt solution, to thereby produce a laminate film.

Comparative Example 3

The procedure of Example 1 was repeated, except that an aqueous potassium chloride solution ($1\times10^{-6}$ mol/L) was applied onto the inorganic thin film such that the potassium ion amount in the coating was adjusted to about 0.9 μg/m², to thereby produce a laminate film.

Comparative Example 4

The procedure of Example 1 was repeated, except that an aqueous potassium chloride saturated solution (about 2.7 mol/L) was applied onto the inorganic thin film. A salt was deposited during drying, resulting in bad appearance of the film. The film was of no value for serving as wrapping film.

Comparative Example 5

The procedure of Example 1 was repeated, except that an aqueous iron chloride solution ($1\times10^{-3}$ mol/L) was applied onto the inorganic thin film such that the iron ion amount in the coating was adjusted to about 1.3 mg/m², to thereby produce a laminate film.

Comparative Example 6

The procedure of Example 1 was repeated, except that an aqueous ionomer-type urethane resin liquid (AP-40N, product of Dainippon Ink and Chemicals, Inc.) was applied onto the inorganic thin film, to thereby produce a laminate film.

TABLE 1-1

| | | Percent water vapor permeation ($g/m^2/24$ h) | | ICP (μg/ | ToF-SIMS | |
|---|---|---|---|---|---|---|
| | Coating liquid | Day 1 | Day 14 | $m^2$) | A/B | C/B |
| Ex. 1 | KCl aqueous solution $1\times10^{-3}$ mol/L | 0.11 | 0.05 | 16 | 1.2 | 0.08 |
| Ex. 2 | NaCl aqueous solution $1\times10^{-3}$ mol/L | 0.13 | 0.10 | 20 | 1.1 | 0.07 |
| Ex. 3 | $NH_4Cl$ aqueous solution $1\times10^{-3}$ mol/L | 0.37 | 0.12 | 1.5 | 0.8 | 0.06 |
| Ex. 4 | PVA + silica + KCl aqueous solution | 0.11 | 0.04 | 200 | 12 | 0.09 |
| Ex. 5 | oxazoline + acrylic + urethane aqueous liquid/KCl aqueous solution | 0.23 | 0.09 | 18 | 1.2 | 0.08 |
| Ex. 6 | KCl aqueous solution $1\times10^{-2}$ mol/L | 0.10 | 0.04 | 30 | 2.8 | 0.10 |

TABLE 1-1-continued

| | Coating liquid | Percent water vapor permeation (g/m²/24 h) Day 1 | Percent water vapor permeation (g/m²/24 h) Day 14 | ICP (μg/m²) | ToF-SIMS A/B | ToF-SIMS C/B |
|---|---|---|---|---|---|---|
| Ex. 7 | KCl aqueous solution 1 × 10⁻⁴ mol/L | 0.41 | 0.11 | 8 | 0.5 | 0.05 |
| Ex. 8 | LiCl aqueous solution 1 × 10⁻³ mol/L | 0.15 | 0.06 | 5 | 1.1 | 0.06 |
| Ex. 9 | CsCl aqueous solution 1 × 10⁻³ mol/L | 0.10 | 0.04 | 60 | 1.3 | 0.09 |
| Ex. 10 | CaCl₂ aqueous solution 1 × 10⁻³ mol/L | 0.24 | 0.06 | 10 | 0.9 | 0.06 |
| Ex. 11 | MgCl₂ aqueous solution 1 × 10⁻³ mol/L | 0.25 | 0.08 | 6 | 0.9 | 0.05 |

TABLE 1-2

| | Coating liquid | Percent water vapor permeation (g/m²/24 h) Day 1 | Percent water vapor permeation (g/m²/24 h) Day 14 | ICP (μg/m²) | ToF-SIMS A/B | ToF-SIMS C/B |
|---|---|---|---|---|---|---|
| Ex. 12 | BaCl₂ aqueous solution 1 × 10⁻³ mol/L | 0.20 | 0.06 | 30 | 0.90 | 0.06 |
| Ex. 13 | Na di(tridecylsulfo-succinate) in toluene 1 × 10⁻³ mol/L | 0.30 | 0.12 | 13 | 0.80 | 0.05 |
| Ex. 14 | CaO aqueous solution 1 × 10⁻³ mol/L, water washing after coating | 0.26 | 0.08 | 8 | 0.70 | 0.05 |
| Ex. 15 | NaCl Aqueous solution 1 × 10⁻³ mol/L, heating after coating | 0.11 | 0.05 | 24 | 1.3 | 0.08 |
| Ex. 16 | Urethane aqueous liquid + KCl aqueous solution | 0.10 | 0.04 | 30 | 2.8 | 0.10 |
| Ex. 17 | Acrylic aqueous liquid + KCl aqueous solution | 0.10 | 0.04 | 28 | 2.7 | 0.09 |
| Ex. 18 | Ester aqueous liquid + KCl aqueous solution | 0.10 | 0.04 | 34 | 3.0 | 0.09 |
| Comp. Ex. 1 | none | 0.72 | 0.15 | 1.5 | 0.14 | 0.03 |
| Comp. Ex. 2 | Ion exchange water | 0.68 | 0.14 | 1.5 | 0.14 | 0.03 |
| Comp. Ex. 3 | KCl aqueous solution 1 × 10⁻⁶ mol/L | 0.69 | 0.14 | 1.8 | 0.18 | 0.04 |
| Comp. Ex. 5 | FeCl₃ aqueous solution 1 × 10⁻³ mol/L | 0.65 | 0.14 | — | — | 0.03 |
| Comp. Ex. 6 | Urethane aqueous liquid | 0.70 | 0.15 | 2.0 | 0.15 | 0.03 |

The gas barrier film of the present invention exhibits higher gas barrier performance while the number of processing steps and an increase in cost are suppressed to minimum levels, and can exhibit sufficient gas barrier performance from immediately after production thereof. Therefore, the gas barrier film is suitably employed, since the film satisfies characteristic level of wrapping materials in recent years.

The invention claimed is:

1. A gas barrier film comprising a thermoplastic polymer film, and an inorganic thin film provided on at least one surface of the thermoplastic polymer film, which gas barrier film is formed by applying, to the inorganic thin film, a solution which contains at least one ion species selected from the group consisting of alkali metal ions, alkaline earth metal ions, and ammonium ions and originating from a low-molecular-weight electrolyte having a molecular weight of 1,000 or less and which has a total ion concentration of $1 \times 10^{-5}$ mol/L or more and less than 10 mol/L and a solution concentration less than a saturation concentration, and wherein the inorganic thin film has a thickness of from 0.1 to 500 nm.

2. A gas barrier film as described in claim 1, wherein the total ion concentration of at least one ion species selected from the group consisting of alkali metal ions, alkaline earth metal ions, and ammonium ions and originating from a low-molecular-weight electrolyte having a molecular weight of 1,000 or less is $1 \times 10^{-4}$ mol/L or more and less than $1 \times 10^{-1}$ mol/L, and the solution concentration is less than a saturation concentration.

3. A gas barrier film as described in claim 1, wherein the inorganic thin film contains silicon oxide.

4. A gas barrier film as described in claim 3, wherein the thin film containing silicon oxide has a ratio of total ion intensity A to ion intensity B (A/B), as determined by means of a time-of-flight secondary ion mass spectrometer (TOF-SIMS), is $0.20 \leq A/B \leq 100$, wherein ion intensity A represents the sum of peak intensities attributed to total alkali metal ions, alkaline earth metal ions, and ammonium ions contained in the thin film, and ion intensity B represents a peak intensity attributed to $^{30}Si$.

5. A gas barrier film as described in claim 3, wherein the thin film containing silicon oxide has a ratio of ion intensity C to ion intensity B (C/B), as determined by means of a TOF-SIMS, of $0.04 \leq C/B \leq 0.50$, wherein ion intensity B represents a peak intensity attributed to $^{30}Si$, and ion intensity C represents a peak intensity attributed to $^{30}SiOH$.

6. A gas barrier film as described claim 1, which is formed by applying, to the inorganic thin film, a mixture solution containing a solution which contains at least one ion species selected from the group consisting of alkali metal ions, alkaline earth metal ions, and ammonium ions and originating from a low-molecular-weight electrolyte having a molecular weight of 1,000 or less and a solution which contains at least one species selected from a resin and a metal oxide sol.

7. A gas barrier film as described claim 1, which is formed by applying, to the inorganic thin film, a solution which contains at least one ion species selected from the group consisting of alkali metal ions, alkaline earth metal ions, and ammonium ions and originating from a low-molecular-weight electrolyte having a molecular weight of 1,000 or less, to thereby form a layer, and by forming thereon a resin solution coating layer.

8. A gas barrier film as described claim 1, which is formed by applying, to the inorganic thin film, a solution which contains at least one ion species selected from the group consisting of alkali metal ions, alkaline earth metal ions, and ammonium ions and originating from a low-molecular-weight electrolyte having a molecular weight of 1,000 or less, and, subsequently, carrying out heat treatment at 60° C or higher.

9. A gas barrier film comprising a thermoplastic polymer film, and an inorganic thin film provided on at least one surface of the thermoplastic polymer film, which gas barrier film is formed by applying, to the inorganic thin film, a solution which contains at least one ion species selected from the group consisting of alkali metal ions, alkaline earth metal ions, and ammonium ions and originating from a low-molecular-weight electrolyte having a molecular weight of 1,000 or less such that the total weight of the ion species in a film area of 1.00 m$^2$ is adjusted to 1.0 μg to 30 g, and wherein the inorganic thin film has a thickness of from 0.1 to 500 nm.

10. A gas barrier film as described in claim 9, wherein the inorganic thin film contains silicon oxide.

11. A gas barrier film as described in claim 10, wherein the thin film containing silicon oxide has a ratio of total ion intensity A to ion intensity B (A/B), as determined by means of a time-of-flight secondary ion mass spectrometer (TOF-SIMS), is 0.20≦A/B≦100, wherein ion intensity A represents the sum of peak intensities attributed to total alkali metal ions, alkaline earth metal ions, and ammonium ions contained in the thin film, and ion intensity B represents a peak intensity attributed to $^{30}$Si.

12. A gas barrier film as described in claim 10, wherein the thin film containing silicon oxide has a ratio of ion intensity C to ion intensity B (C/B), as determined by means of a TOF-SIMS, of 0.04≦C/B≦0.50, wherein ion intensity B represents a peak intensity attributed to $^{30}$Si, and ion intensity C represents a peak intensity attributed to $^{30}$SiOH.

13. A gas barrier film comprising a thermoplastic polymer film, and an inorganic thin film provided on at least one surface of the thermoplastic polymer film, wherein the thin film has a total alkali metal ion and alkaline earth metal ion concentration in a film area of 1.00 m$^2$, as determined through inductively coupled plasma Auger electron spectroscopy (ICP-AES), of 2.0 μg to 1,000 μg, and wherein the inorganic thin film has a thickness of from 0.1 to 500 nm.

14. A gas barrier film as described claim 13, which is formed by applying, to the inorganic thin film, a mixture solution containing a solution which contains at least one ion species selected from the group consisting of alkali metal ions, alkaline earth metal ions, and ammonium ions and originating from a low-molecular-weight electrolyte having a molecular weight of 1,000 or less and a solution which contains at least one species selected from a resin and a metal oxide sol.

15. A gas barrier film as described claim 13, which is formed by applying, to the inorganic thin film, a solution which contains at least one ion species selected from the group consisting of alkali metal ions, alkaline earth metal ions, and ammonium ions and originating from a low-molecular-weight electrolyte having a molecular weight of 1,000 or less, to thereby form a layer, and by forming thereon a resin solution coating layer.

16. A gas barrier film as described claim 13, which is formed by applying, to the inorganic thin film, a solution which contains at least one ion species selected from the group consisting of alkali metal ions, alkaline earth metal ions, and ammonium ions and originating from a low-molecular-weight electrolyte having a molecular weight of 1,000 or less, and, subsequently, carrying out heat treatment at 60° C. or higher.

17. A method for producing a gas barrier film, which method comprises the steps of:
    forming an inorganic thin film on at least one surface of a thermoplastic polymer film and,
    subsequently, applying, to the inorganic thin film, a solution which contains at least one ion species selected from the group consisting of alkali metal ions, alkaline earth metal ions, and ammonium ions and originating from a low-molecular-weight electrolyte having a molecular weight of 1,000 or less and which has a total ion concentration of 1×10$^{-5}$ mol/L or more and less than 10 mol/L and a solution concentration less than a saturation concentration, wherein the inorganic thin film has a thickness of from 0.1 to 500 nm.

18. A method for producing a gas barrier film, which method comprises the steps of:
    forming an inorganic thin film on at least one surface of a thermoplastic polymer film and,
    applying, to the inorganic thin film, a solution which contains at least one ion species selected from the group consisting of alkali metal ions, alkaline earth metal ions, and ammonium ions and originating from a low-molecular-weight electrolyte having a molecular weight of 1,000 or less such that the total weight of the ion species in a film area of 1.00 m$^2$ is adjusted to 1.0 μg to 30 g, wherein the inorganic thin film has a thickness of from 0.1 to 500 nm.

* * * * *

UNITED STATES PATENT AND TRADEMARK OFFICE
CERTIFICATE OF CORRECTION

| | |
|---|---|
| PATENT NO. | : 7,615,287 B2 |
| APPLICATION NO. | : 10/595789 |
| DATED | : November 10, 2009 |
| INVENTOR(S) | : Chiharu Okawara et al. |

It is certified that error appears in the above-identified patent and that said Letters Patent is hereby corrected as shown below:

Column 8, lines 31-32, should read:

-- inductively coupled plasma atomic emission spectroscopy (ICP-AES) --

Column 10, lines 1-2, should read:

-- inductively coupled plasma atomic emission spectroscopy (ICP-AES) --

Column 17, Claim 13, lines 31-32, should read:

-- inductively coupled plasma atomic emission spectroscopy (ICP-AES) --

Signed and Sealed this
Twenty-ninth Day of March, 2011

David J. Kappos
*Director of the United States Patent and Trademark Office*